(12) United States Patent
Köklü et al.

(10) Patent No.: US 10,840,282 B2
(45) Date of Patent: Nov. 17, 2020

(54) DEMODULATION PIXEL DEVICES, ARRAYS OF PIXEL DEVICES AND OPTOELECTRONIC DEVICES INCORPORATING THE SAME

(71) Applicant: ams Sensors Singapore Pte. Ltd., Singapore (SG)

(72) Inventors: Gözen Köklü, Zurich (CH); Bernhard Büttgen, Adliswil (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 157 days.

(21) Appl. No.: 15/769,867

(22) PCT Filed: Oct. 21, 2016

(86) PCT No.: PCT/SG2016/050513
§ 371 (c)(1),
(2) Date: Apr. 20, 2018

(87) PCT Pub. No.: WO2017/069706
PCT Pub. Date: Apr. 27, 2017

(65) Prior Publication Data
US 2020/0066771 A1 Feb. 27, 2020

Related U.S. Application Data

(60) Provisional application No. 62/244,353, filed on Oct. 21, 2015.

(51) Int. Cl.
*H01L 27/146* (2006.01)
*H01L 31/12* (2006.01)
*G01S 7/4914* (2020.01)

(52) U.S. Cl.
CPC .... *H01L 27/14614* (2013.01); *H01L 27/1461* (2013.01); *H01L 27/14603* (2013.01);
(Continued)

(58) Field of Classification Search
CPC .......... H01L 27/14603; H01L 27/1461; H01L 27/14612; H01L 31/12; H01L 27/14607;
(Continued)

(56) References Cited

U.S. PATENT DOCUMENTS

| 5,379,067 A | 1/1995 | Miura |
| 7,385,232 B2 | 1/2008 | Patrick |

(Continued)

FOREIGN PATENT DOCUMENTS

| CN | 102906876 | 1/2013 |
| EP | 2290393 A2 | 3/2011 |
| EP | 2346079 | 7/2011 |

OTHER PUBLICATIONS

ISA/AU, International Search Report for PCT/SG2016/050513 (dated Feb. 20, 2017).

(Continued)

*Primary Examiner* — Scott B Geyer
(74) *Attorney, Agent, or Firm* — Michael Best and Friedrich LLP

(57) ABSTRACT

Pixel devices and arrays of pixel devices are operable to demodulate modulated light incident on a photo-detection region of the pixel devices. The pixel devices can include floating diffusion implant layers and transfer gates. The floating diffusion implant layers and transfer gates are disposed such that photo-generated charge carriers can be conducted to the floating diffusion implant layers over minimal charge-carrier transport paths.

20 Claims, 12 Drawing Sheets

(52) U.S. Cl.
CPC ........ *H01L 27/14612* (2013.01); *H01L 31/12* (2013.01); *G01S 7/4914* (2013.01)

(58) Field of Classification Search
CPC ......... H01L 27/14614; H01L 27/14616; H01L 27/14643; H01L 2924/12043; G01S 7/4914

See application file for complete search history.

(56) References Cited

U.S. PATENT DOCUMENTS

| | | | |
|---|---|---|---|
| 7,446,353 | B2 | 11/2008 | Matsuyama |
| 7,498,621 | B2 | 3/2009 | Seitz |
| 8,154,097 | B2 | 4/2012 | Kim et al. |
| 8,299,472 | B2 | 10/2012 | Yu et al. |
| 8,537,255 | B2 | 9/2013 | Lee et al. |
| 8,792,035 | B2 | 7/2014 | Yamada |
| 9,411,998 | B2 | 8/2016 | Powell et al. |
| 2006/0192938 | A1 | 8/2006 | Kawahito |
| 2007/0158770 | A1 | 7/2007 | Kawahito |
| 2009/0224139 | A1 | 9/2009 | Buettgen et al. |
| 2010/0187401 | A1 | 7/2010 | Kawahito |
| 2014/0103412 | A1 | 4/2014 | Lee et al. |
| 2014/0138748 | A1 | 5/2014 | Janesick |
| 2014/0151753 | A1 | 6/2014 | Konishi |
| 2014/0320718 | A1 | 10/2014 | Fan |
| 2015/0029374 | A1* | 1/2015 | Kitano ................ H01L 27/1464 348/308 |
| 2015/0041944 | A1 | 2/2015 | Kim et al. |

OTHER PUBLICATIONS

Hansard, et al., "time of Flight Cameras; Principles, Methods, and Applications," Springer, pp. 95, SrpingerBreifs in computer Science, ISBN 978-1-4471-4658-2 (2012).

Yiqiang, Li & Binqiao, Li & Jiangtao, Xu & Gao, Zhiyuan & Chao, xu & Yu, Sun, "Charge transfer efficiency improvement of a 4-T pixel by the optimization of electrical potential distribution under the transfer gate.," Journal of Semiconductors. 33. 124004. 10.1088/1674-4926/33/12/124004 (2012).

Jiaju Ma and Eric R. Rossum, A Pump-Gate Jot Device with High Conversion Gain for a Quanta Image Sensor, Journal of the Electron Devices Society, vol. 3, No. 2, Mar. 2015.

Weiping, et al., "Collection efficiency and charge transfer optimization for a 4-T pixel with multi n-type implants," Chinese Institute of Electronics, Journal of Semiconductors, vol. 32, No. 12 (2011).

Vincent Goiffon, et al., "Influence of Transfer Gate Design and Bias on the Radiation hardness of Pinned Photodiode CMOS Image Sensors," IEEE Transactions on Nuclear Science, pp. 3290-3301 (2014).

Oggier, et al., "SwissRanger SR3000 and First Experiences based on Miniaturized 3D-TOF Cameras," First Range Imaging Res. Day at ETH, Imperial College of Science, Medicine (1968).

Oggier, et al., "Novel Pixel Architecture with Inherent Background Suppression for 3D Time-of-Flight Imaging," SPIE Proceedings vol. 5665, Videometrics VIII, San Jose, CA (2005).

Lehmann, et al., "Smart pixels for future 3D-TOF sensors," 2005 IEEE Workshop on Charge-Coupled Devices and Advanced Image Sensors, Karuizawa, Nagano, Japan, Jun. 9-11, 2005.

Buttgen, et al., "CCD/CMOS Lock-In Pixel for Range Imaging: Challenges, Limitations and State-of-the-Art." Proceedings of $1^{st}$ Range Imaging Research Day (Zurich, Switzerland, 2005), pp. 21-32.

European Patent Office Search Report for Related Application No. 16857900.1 dated May 24, 2019 (4 pages).

European Patent Office Examination Report for Related Application No. 16857900.1 dated Jun. 28, 2019 (7 pages).

* cited by examiner

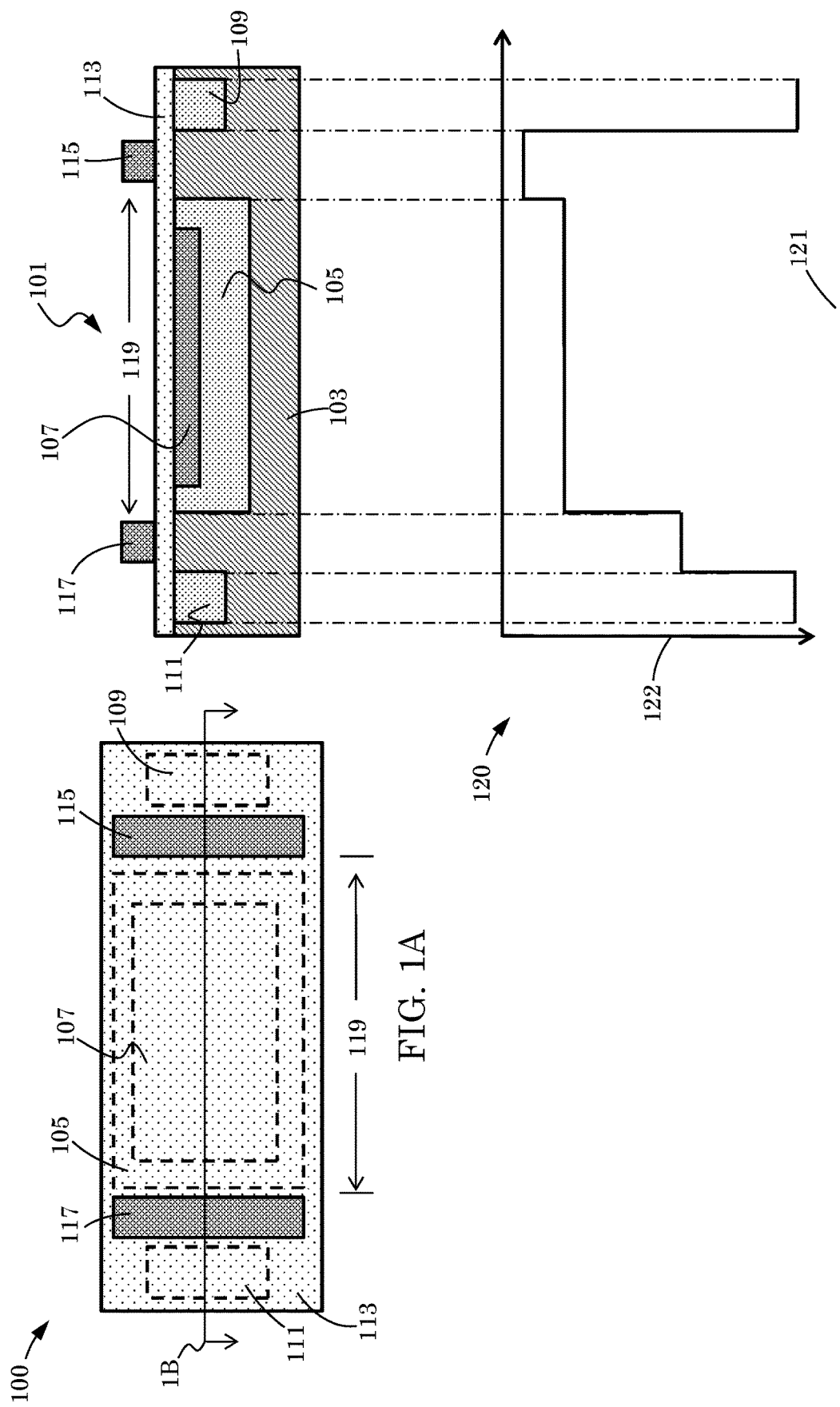

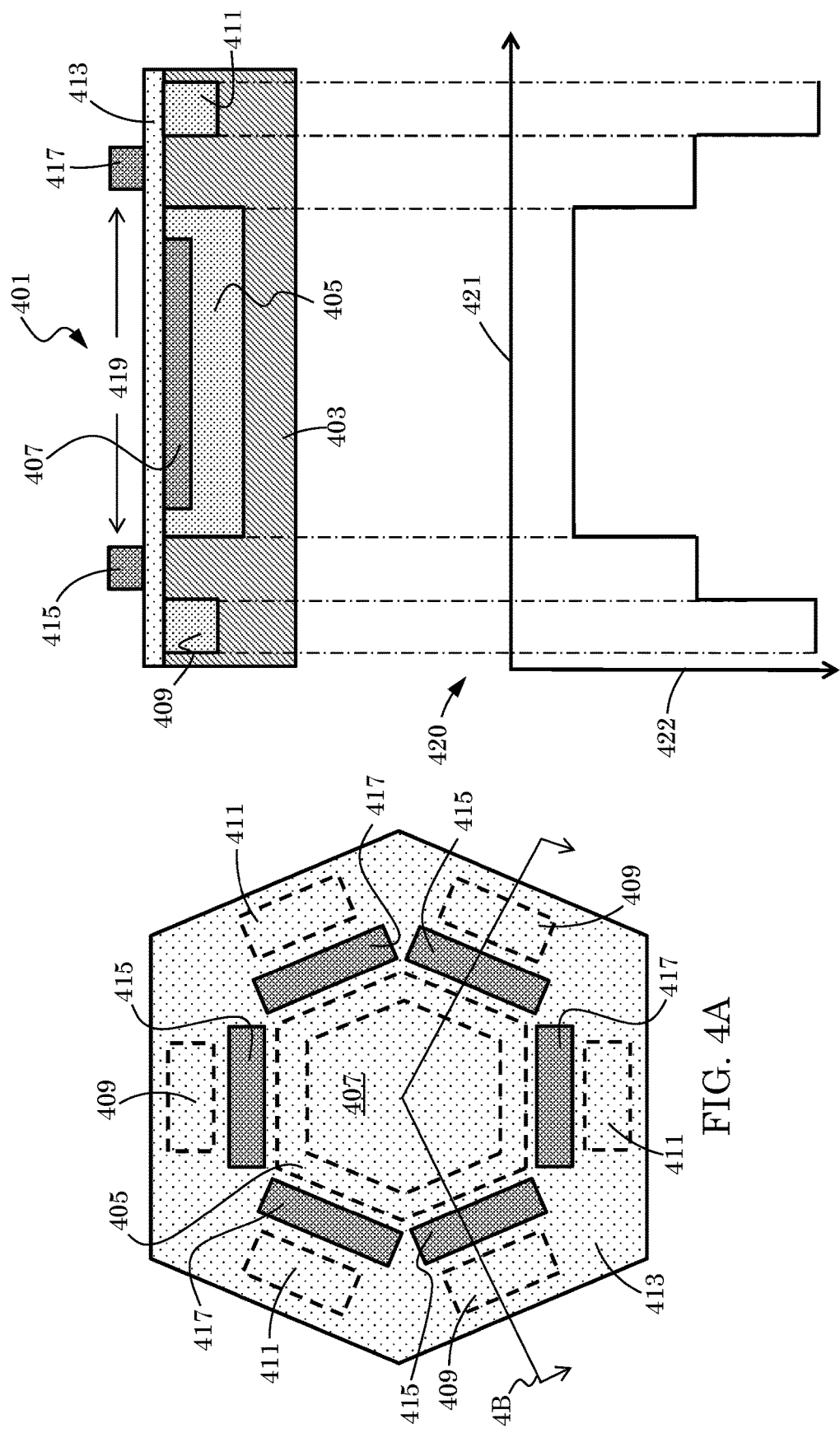

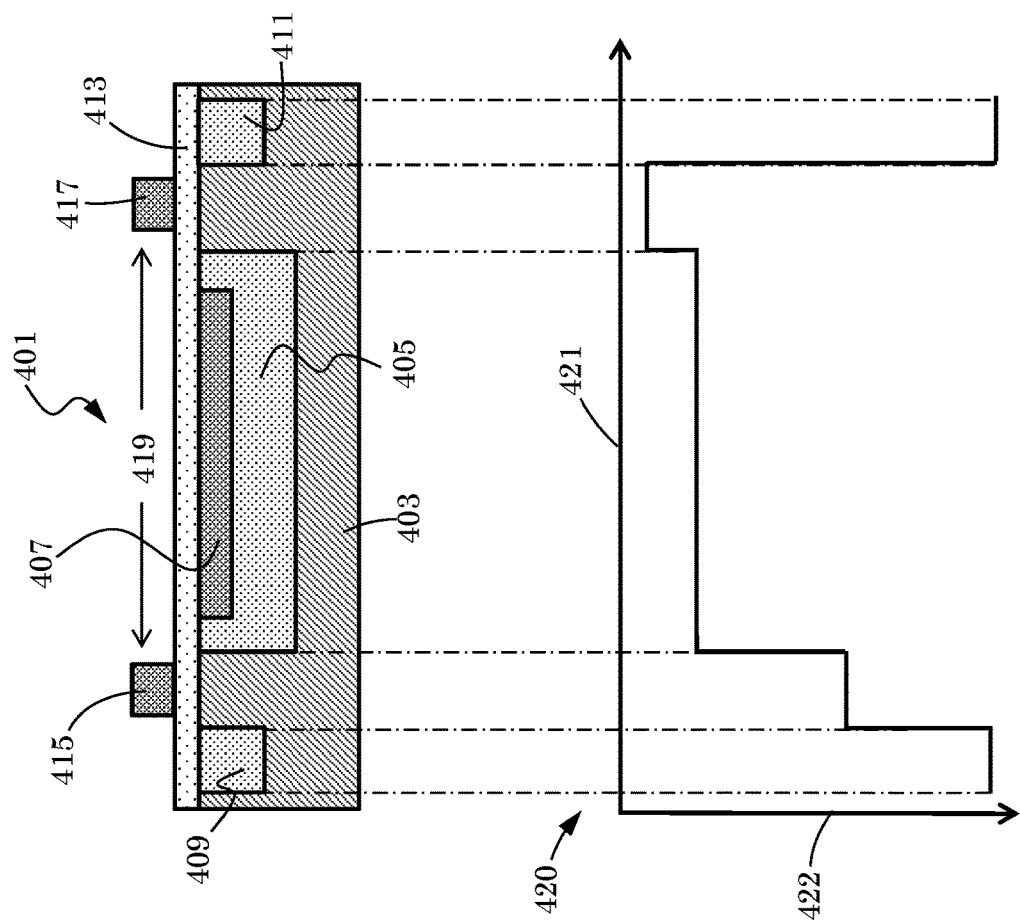
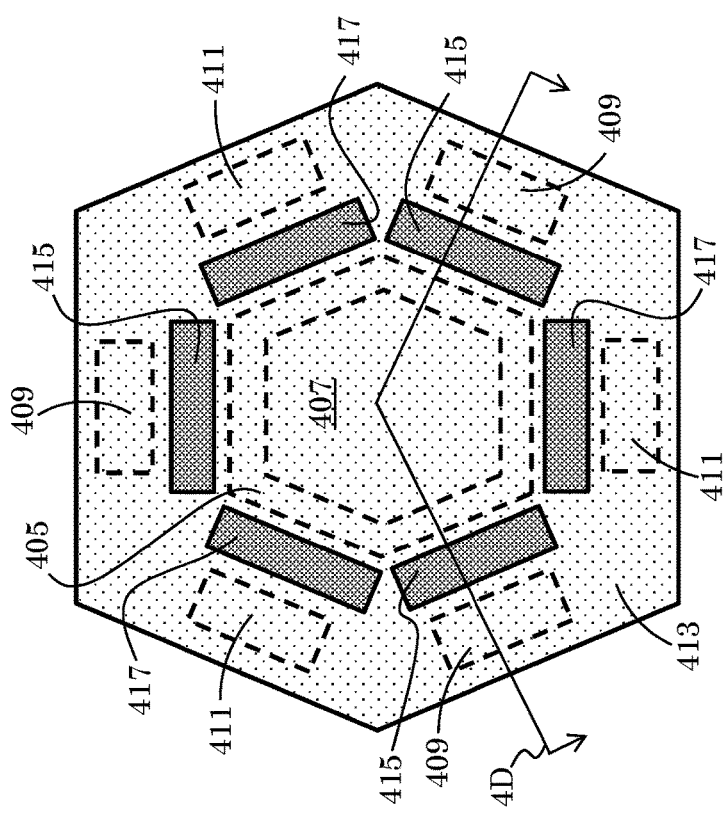
FIG. 4C
FIG. 4D

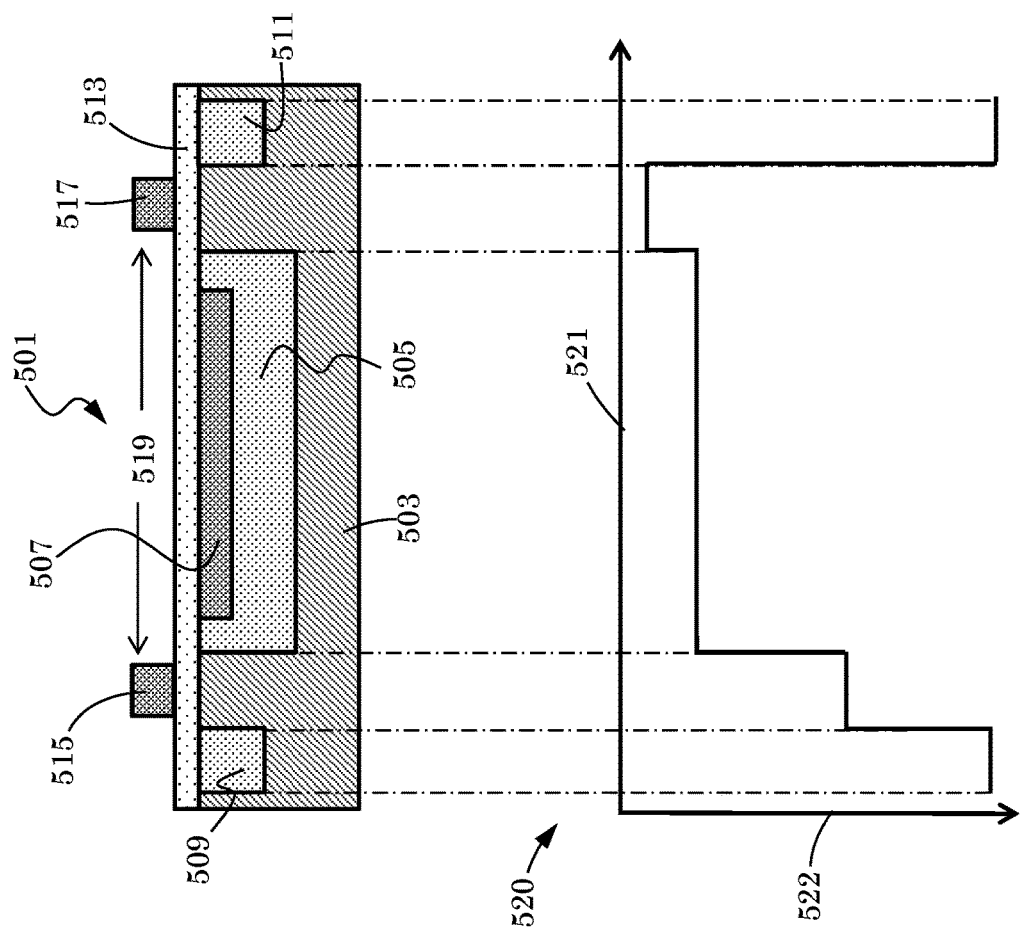
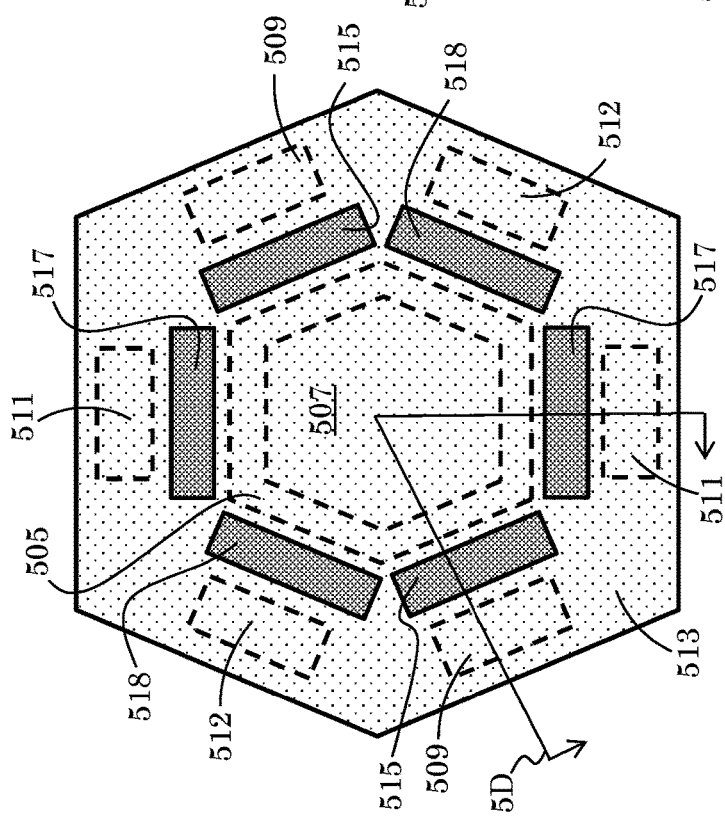
FIG. 5C
FIG. 5D

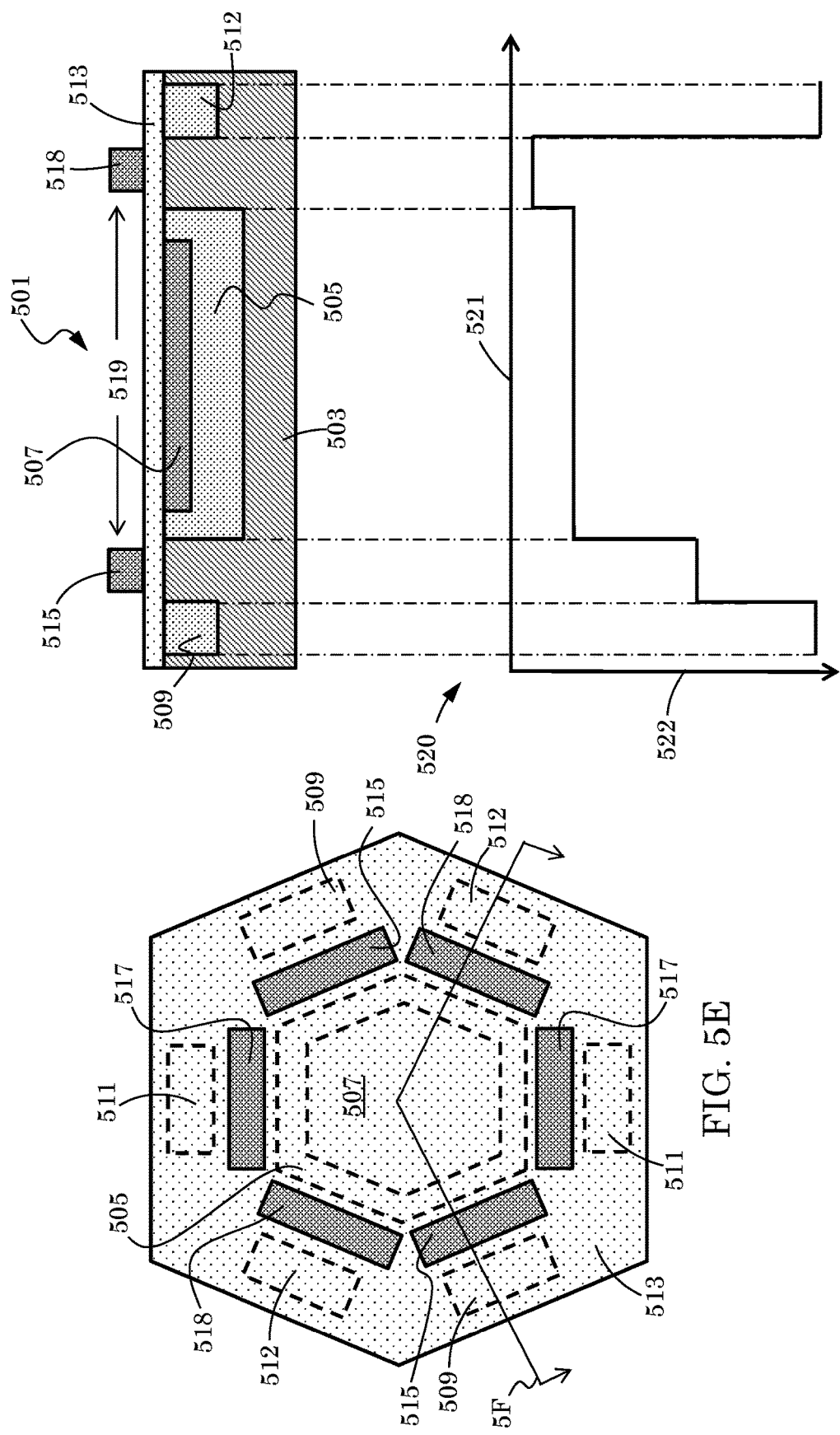

DEMODULATION PIXEL DEVICES, ARRAYS OF PIXEL DEVICES AND OPTOELECTRONIC DEVICES INCORPORATING THE SAME

FIELD OF THE DISCLOSURE

The present disclosure relates to pixel devices, arrays of pixel devices, and optoelectronic devices incorporating the same operable to demodulate incident modulated light for the collection of distance data.

BACKGROUND

A pixel device operable to generate signals from incident light (i.e., electromagnetic radiation) includes a photo-detection region. Light incident on the photo-detection region generates charge-carriers which travel through the photo-detection region and are sampled, thereby generating signals with characteristics of the incident light. For example, modulated incident light can generate charge carriers with modulation characteristics representative of the modulated incident light. In some instances, however, light incident on the photo-detection region may not be of sufficient intensity to generate adequate numbers of charge-carriers to produce reliable signals. In such an instance, the signal-to-noise ratio may be too small for a given application. Consequently, a pixel device may be constructed with a large photo-detection region in order to collect more light when the intensity of incident light is low. However, charge-carriers generated in such a large photo-detection region travel over longer distances before being sampled, thereby slowing the acquisition of signals by the pixel device or the optoelectronic device into which it is incorporated. Slow signal acquisition imposes significant limitations on the potential applications of such devices.

Various approaches for increasing light sensitivity while circumventing long charge-carrier transport paths have been attempted. For example, some pixel architectures include a plurality of electrically interconnected transfer gates and floating diffusion implant layers. This architecture, however, does not permit the efficient demodulation of incident modulated light as required for, instance, for indirect time-of-flight technologies. In such instances, information contained within the incident modulated light, such as phase-delays associated with distance to a target object, would be lost or unused.

Other approaches for increasing light sensitivity while circumventing lengthy charge-carrier transport paths have been attempted. For example, pinned photodiodes with enhanced lateral conductivity of photo-generated charge carriers have been developed, however, this and other approaches have similar limitations to applications requiring the demodulation of incident modulated light.

SUMMARY

The present disclosure describes pixel devices and optoelectronic devices in which the pixel devices are incorporated. The pixel devices combine large photo-detection regions while minimizing charge-carrier transport paths in order to mitigate or eliminate the limitations described in-part above.

In one aspect, for example, a pixel device operable to demodulate incident modulated light includes a pinned photodiode structure including a substrate of a first type, and an implant layer of a second type. The pixel device further includes an implant layer of the first type disposed within the implant layer of the second type, an insulator disposed on a surface of the substrate, and a photo-detection region. Modulated light and common mode light incident on the photo-detection region generates charge-carriers of the second type within the photo-detection region. The charge-carriers have modulation characteristics of the incident modulated light. The pixel device further includes a plurality of first transfer gates and a plurality of second transfer gates disposed on a surface of the insulator such that the plurality of first transfer gates and the plurality of second transfer gates are operable to generate a field within the substrate of the first type. The pixel device further includes a plurality of first floating diffusion implant layers of the second type and a plurality of second floating diffusion implant layers of the second type disposed within the substrate of the first type. The plurality of first transfer gates and the plurality of second transfer gates are operable to conduct the charge-carriers to the plurality of first floating diffusion implant layers at a first instance in time, and the plurality of first transfer gates and the plurality of second transfer gates are operable to conduct the charge-carriers to the plurality of second floating diffusion implant layers at a second instance in time.

In some instances, the pixel device operable to demodulate incident modulated light includes at least one auxiliary transfer gate and at least one auxiliary floating diffusion implant layer.

In some instances, the pixel device operable to demodulate incident modulated light includes first, second, and auxiliary transfer gates operable to conduct charge-carriers generated by a common mode light to an auxiliary floating diffusion layer.

In some instances, the pixel device operable to demodulate incident modulated light includes a plurality of auxiliary transfer gates and a plurality of auxiliary floating diffusion implant layers wherein first transfer gates, second transfer gates, and the plurality of auxiliary transfer gates can be operable to conduct charge-carriers generated by a common mode light to a plurality of auxiliary floating diffusion implant layers.

In some instances, the pixel device operable to demodulate incident modulated light includes a plurality of first transfer gates, a plurality of second transfer gates, a plurality of first floating diffusion implant layers, and a plurality of second floating diffusion implant layers circumferentially disposed around a photo-detection region such that charge-carrier transport paths to the floating diffusion implant layers can be minimized.

In some instances, the pixel device operable to demodulate incident modulated light includes a plurality of first transfer gates, a plurality of second transfer gates, a plurality of first floating diffusion implant layers, and a plurality of second floating diffusion implant layers hexagonally disposed around the photo-detection region.

In some instances, the pixel device operable to demodulate incident modulated light includes a plurality of first transfer gates, a plurality of second transfer gates, a plurality of first floating diffusion implant layers, and a plurality of second floating diffusion implant layers octagonally disposed around the photo-detection region.

In a further aspect, the pixel device operable to demodulate incident modulated light includes a plurality of first and second transfer gates, wherein each first transfer gate within the plurality of first transfer gates can be disposed at opposing sides of the photo-detection region, and each second transfer gate within the plurality of second transfer gates can be disposed at opposing sides of the photo-detection region.

In some instances, the pixel device operable to demodulate incident modulated light includes charge-carriers, wherein the charge-carriers have modulation characteristics of incident modulated light. A plurality of first transfer gates, and a plurality of second transfer gates can be operable to conduct the charge-carriers to a plurality of first floating diffusion implant layers, and a plurality of second floating diffusion implant layers at a first instance in time. The plurality of first transfer gates, and the plurality of second transfer gates can be operable to conduct the charge-carriers to the plurality of first floating diffusion implant layers, and the plurality of second floating diffusion implant layers at a second instance in time. The plurality of first transfer gates, and the plurality of second transfer gates can be operable to conduct the charge-carriers to the plurality of first floating diffusion implant layers, and the plurality of second floating diffusion implant layers at a third instance in time.

In some instances, the pixel device operable to demodulate incident modulated light includes charge-carriers, wherein a plurality of first transfer gates, a plurality of second transfer gates, and at least one auxiliary transfer gate can be operable to conduct the charge-carriers to a plurality of first floating diffusion implant layers, a plurality of second floating diffusion implant layers, or at least one auxiliary floating diffusion implant layer at a first instance in time. The plurality of first transfer gates, the plurality of second transfer gates, and the at least one auxiliary transfer gate can be operable to conduct the charge-carriers to the plurality of first floating diffusion implant layers, the plurality of second floating diffusion implant layers, or the at least one auxiliary floating diffusion implant layer at a second instance in time. The plurality of first transfer gates, the plurality of second transfer gates, and the at least one auxiliary transfer gate can be operable to conduct the charge-carriers to the plurality of first floating diffusion implant layers, the plurality of second floating diffusion implant layers, or the at least one auxiliary floating diffusion implant layer at a third instance in time.

In some instances, the pixel device operable to demodulate incident modulated light includes charge-carriers, wherein a plurality of first transfer gates, and a plurality of second transfer gates can be operable to conduct the charge-carriers to a plurality of first floating diffusion implant layers, and a plurality of second floating diffusion implant layers at a first instance in time. The plurality of first transfer gates, and the plurality of second transfer gates can be operable to conduct the charge-carriers to the plurality of first floating diffusion implant layers, and the plurality of second floating diffusion implant layers at a second instance in time. The plurality of first transfer gates, and the plurality of second transfer gates can be operable to conduct the charge-carriers to the plurality of first floating diffusion implant layers, and the plurality of second floating diffusion implant layers at a third instance in time. The plurality of first transfer gates, and the plurality of second transfer gates can be operable to conduct the charge-carriers to the plurality of first floating diffusion implant layers, and the plurality of second floating diffusion implant layers at a fourth instance in time.

In some instances, the pixel device operable to demodulate incident modulated light includes charge-carriers, wherein the charge-carriers have modulation characteristics of incident modulated light. A plurality of first transfer gates, a plurality of second transfer gates, and at least one auxiliary transfer gate can be operable to conduct the charge-carriers to a plurality of first floating diffusion implant layers, a plurality of second floating diffusion implant layers, or at least one auxiliary floating diffusion implant layer at a first instance in time. The plurality of first transfer gates, the plurality of second transfer gates, and the at least one auxiliary transfer gate can be operable to conduct the charge-carriers to the plurality of first floating diffusion implant layers, the plurality of second floating diffusion implant layers, or the at least one auxiliary floating diffusion implant layer at a second instance in time. The plurality of first transfer gates, the plurality of second transfer gates, and the at least one auxiliary transfer gate can be operable to conduct the charge-carriers to the plurality of first floating diffusion implant layers, the plurality of second floating diffusion implant layers, or the at least one auxiliary floating diffusion implant layer at a third instance in time. The plurality of first transfer gates, the plurality of second transfer gates, and the at least one auxiliary transfer gate can be operable to conduct the charge-carriers to the plurality of first floating diffusion implant layers, the plurality of second floating diffusion implant layers, or the at least one auxiliary floating diffusion implant layer at a fourth instance in time.

In some implementations, the pixel device operable to demodulate incident modulated light includes a first floating diffusion implant layer disposed within a substrate and shared with another pixel device.

In some implementations, the pixel device operable to demodulate incident modulated light includes a second floating diffusion implant layer disposed within a substrate and shared with another pixel device.

In some instances, the pixel device operable to demodulate incident modulated light includes a plurality of first transfer gates, a plurality of second transfer gates, a plurality of first floating diffusion implant layers, and a plurality of second floating diffusion implant layers hexagonally disposed around a photo-detection region. At least one of the plurality of first floating diffusion implant layers and at least one of the plurality of second floating diffusion implant layers can be shared with another pixel device.

In some instances, an optoelectronic device operable to determine distances to an object or objects in a scene includes a light source operable to emit modulated light onto an object or objects in a scene, wherein at least a portion of the modulated light is reflected from the object or objects in the scene. The optoelectronic device further includes an optical assembly operable to focus some of the portion of the modulated light onto a plurality of pixel devices, wherein at least one of the pixel devices within the plurality is operable to demodulate incident modulated light. The optoelectronic device further includes a processor operable to determine distance data from signals generated from the at least one pixel devices within the plurality.

Other aspects, features and advantages will be readily apparent from the following detailed description, the accompanying drawings, and the appended claims.

BRIEF DESCRIPTION OF THE DRAWINGS

FIG. 1A depicts a schematic top view of an example pixel device.

FIG. 1B depicts a schematic cross-sectional view and a potential distribution spanning a lateral dimension of the example pixel device.

FIG. 4A depicts a schematic top view of yet another example pixel device.

FIG. 4B depicts a schematic cross-sectional view and a potential distribution spanning a lateral dimension of the example pixel device.

FIG. 4C depicts a schematic top view of the example pixel device.

FIG. 4D depicts another schematic cross-sectional view and a potential distribution spanning another lateral dimension of the example pixel device.

FIG. 5C depicts a schematic top view of the example pixel device.

FIG. 5D depicts another schematic cross-sectional view and a potential distribution spanning another lateral dimension of the example pixel device.

FIG. 5E depicts a schematic top view of the example pixel device.

FIG. 5F depicts still another schematic cross-sectional view and a potential distribution spanning still another lateral dimension of the example pixel device.

DETAILED DESCRIPTION

Figures 2A, 2B:
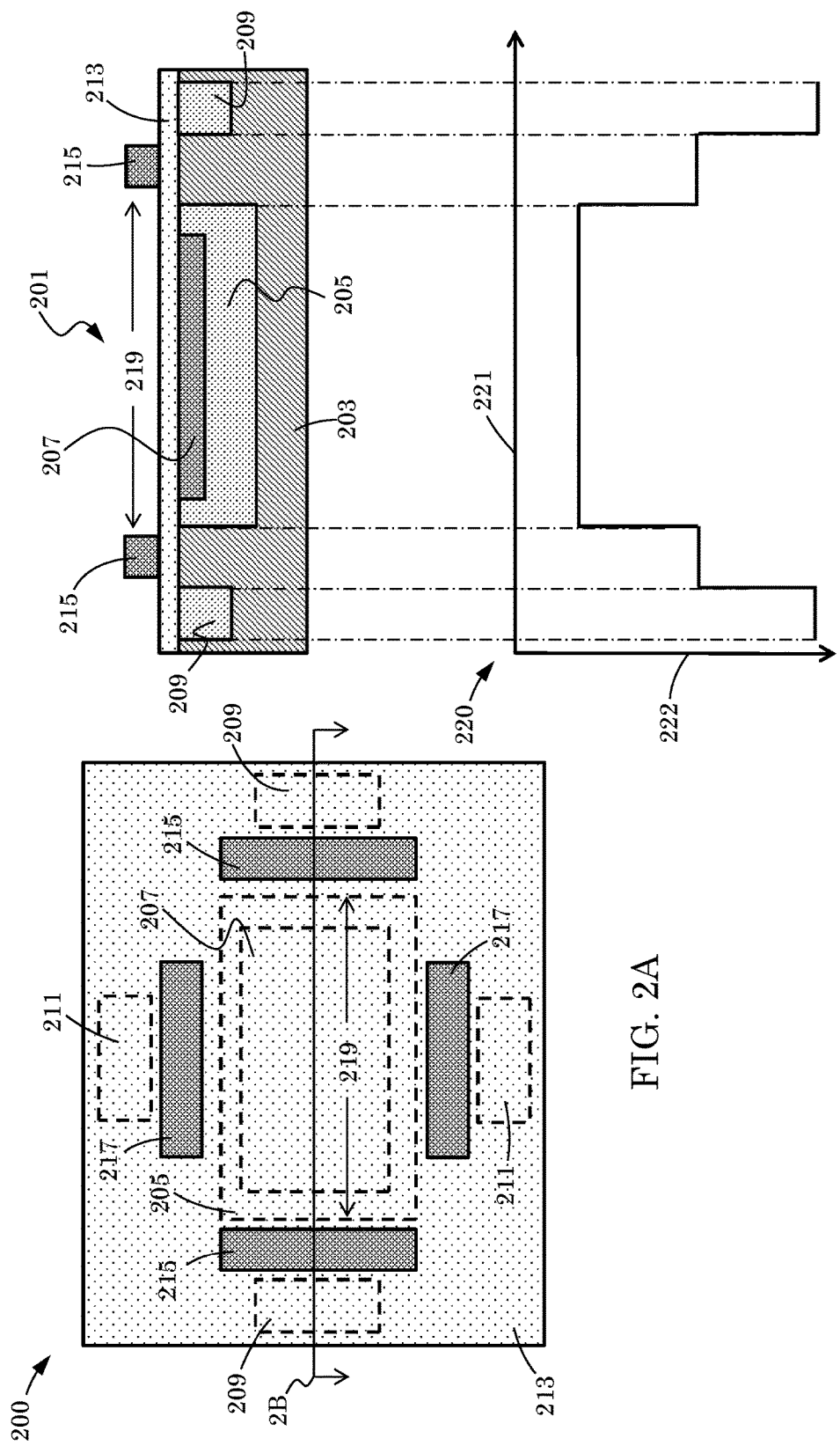
FIG. 2A depicts a schematic top view of another example pixel device.
FIG. 2B depicts a schematic cross-sectional view and a potential distribution spanning a lateral dimension of the example pixel device.

FIG. 1A depicts a schematic top view of an example pixel device. A pixel device 100 includes a pinned photodiode structure 101. The pinned photodiode structure 101 includes a p-type substrate 103, an n-type implant layer 105 and a p-type implant layer 107. The p-type substrate 103 can be composed of a semiconductor material (e.g., crystalline silicon, polycrystalline silicon, germanium, indium gallium arsenide, lead sulphide, or indium phosphide) where the majority of charge-carriers within the p-type substrate 103 are holes (e.g., occurring intrinsically or introduced via acceptor doping). The n-type implant layer 105 can be composed of a semiconductor material (e.g., crystalline silicon, polycrystalline silicon, germanium, indium gallium arsenide, lead sulphide, or indium phosphide) and can be the same material or can be contiguous with (e.g., epitaxially grown or deposited on) the p-type substrate 103. Further the majority of charge-carriers within the n-type implant layer 105 can be electrons (e.g., occurring intrinsically or introduced via donor doping). The p-type implant layer 107 can be composed of a semiconductor material (e.g., crystalline silicon, polycrystalline silicon, germanium, indium gallium arsenide, lead sulphide, or indium phosphide) and can be the same material or can be contiguous with (e.g., epitaxially grown or deposited on) the p-type substrate 103. Further the majority of charge-carriers within the p-type implant layer 107 can be holes (e.g., occurring intrinsically or introduced via acceptor doping).

The pixel device 100 further includes a first floating diffusion implant layer 109 and a second floating diffusion implant layer 111 (e.g., floating diffusion nodes or sense nodes). The majority of charge-carriers within the first floating diffusion implant layer 109 and second floating diffusion implant layer 111 can be electrons (e.g., occurring intrinsically or introduced via donor doping). The first floating diffusion implant layer 109 and the second floating diffusion implant layer 111 can be composed of a semiconductor material (e.g., crystalline silicon, polycrystalline silicon, germanium, indium gallium arsenide, lead sulphide, or indium phosphide) and can be the same material or can be contiguous with (e.g., epitaxially grown or deposited on) the p-type substrate 103. The pixel device 100 further includes an insulator layer 113 deposited on the p-type substrate 103, a first transfer gate 115 (i.e., a component of an insulated gate structure), and a second transfer gate 117 (i.e., a component of another insulated gate structure), and a photo-detection region 119. The photo-detection region 119 delineates a photo-sensitive region within the pixel device 100. In some implementations the photo-detection region 119 includes a region of charge-carrier depletion (e.g., a region of intrinsic charge-carrier concentration). The insulator layer 113 can be substantially electrically insulating and substantially transparent to wavelengths of light such as light having wavelengths in the visible or invisible ranges (e.g., near infrared or infrared light). The insulator layer 113 can be composed of a substantially electrically insulating and transparent material (e.g., crystalline silicon dioxide or polycrystalline silicon dioxide). The insulator layer 113 insulates the first transfer gate 115 and the second transfer gate 117 from the p-type substrate 103. The first transfer gate 115 and second transfer gate 117 can be composed of substantially transparent material (e.g., polycrystalline silicon).

Voltages can be applied to the first transfer gate 115 and the second transfer gate 117. Accordingly, the first transfer gate 115 and the second transfer gate 117 can be operable to generate an electric drift field in the pixel device 100 (e.g., a fringe-field effect). In some implementations, the insulator layer 113 can have a thickness sufficient to enable the capacitive coupling between the p-type substrate 103 and the first transfer gate 115 and second transfer gate 117 such that the voltage levels on the first and second transfer gates 115, 117, respectively, are reflected as a potential distribution 120 within the p-type substrate 103. In some implementations where different voltage levels are applied to the first transfer gate 115 and the second transfer gate 117, respectively, an electric drift field can arise within the pixel device 100 (e.g., laterally within the photo-detection region 119). An electric drift field, manifested as a potential distribution, within the pixel device 100 can facilitate the conduction of photo-generated charge carries, generated within the photo-detection region 119, to either the first floating diffusion implant layer 109 or the second floating diffusion implant layer 111 at any given instance in time. An example of such a potential distribution 120 as described above is illustrated in FIG. 1B.

FIG. 1B depicts a schematic cross-sectional view and the potential distribution 120 spanning a lateral dimension of the example pixel device depicted in FIG. 1A. The potential distribution 120 spanning a lateral dimension 121 of the pixel device 100 (i.e., along the line 1B) is depicted in a schematic plot with the lateral dimension 121 on the x-axis and potential 122 on the y-axis. As described above, the voltage levels on the first transfer gate 115 and the second transfer gate 117 are operable to generate a potential distribution 120 with particular characteristics. For example, the potential distribution 120 depicted in FIG. 1B can conduct charges generated within the photo-detection region 119 to the second floating diffusion implant layer 111 and can inhibit charge carriers from being conducted into the first floating diffusion implant layer 109.

The pixel device 100 or arrays of such pixel devices can be employed in data-collection applications utilizing modulated light incident on the photo-detection region 119 of the pixel device 100. Incident modulated light generates charge carriers in the photo-detection region 119 with characteristics of the incident modulated light. The charge carriers can be sampled at different instances in time within a modulation period. For example, charge carriers can be sampled at instances corresponding to 0°, 180°, 270°, or 360° of the modulation. Accordingly, charge carriers can be conducted alternately from the photo-detection region 119 via the potential distribution 120 into the first floating diffusion implant layer 109 at a first instance in time, and into the second floating diffusion layer 111 at a second instance in time.

This alternate transport into the floating diffusion implant layers 109, 111 can be repeated over multiple instances in time, such that sufficient charge carriers are alternately conducted to the first and second floating diffusion implant layers 109, 111 in order to produce reliable signals. The signals can be used to determine a phase-shift of the incident modulated light which can be used to determine distance to an object via the indirect time-of-flight technique. However, since 1) the two floating diffusion implant layers 109, 111 are disposed on opposing sides of the photo-detection region 119, and 2) the entire photo-detection region 119 is used to collect light and generate the charge carriers conducted to a single floating diffusion implant layer at any given instance in time, some of the charge carriers are conducted over transport paths spanning the entire length of the photo-detection region 119 at any given instance in time thereby plaguing this approach with some limitations.

FIG. 2A depicts a schematic top view of another example pixel device 200. The pixel device 200 includes components as described above such as a pinned photodiode structure 201, a p-type substrate 203, an n-type implant layer 205, a p-type implant layer 207 and a photo-detection region 219. However, the pixel device 200 also includes multiple first transfer gates 215, multiple second transfer gates 217, multiple first floating diffusion implant layers 209, and multiple second floating diffusion implant layers 211. The multiple transfer gates 215, 217 together with the multiple floating diffusion implant layers 209, 211 permit charge carriers generated in the photo-detection region 219 to be conducted to multiple floating diffusion implant layers at any given instance in time as opposed to a single floating diffusion implant layer as illustrated in FIG. 1A and FIG. 1B. For example, at a first instance in time charge-carriers can be conducted to the multiple first floating diffusion implant layers 209, and at a second instance in time charge-carriers can be conducted to the multiple second floating diffusion implant layers 211. As the charge carrier are conducted to multiple floating diffusion implant layers at any given instance, their transport lengths are significantly reduced. As above, alternate transport into the multiple floating diffusion implant layers 209, 211 can be repeated over multiple instances in time, such that sufficient charge carriers are alternately conducted to the first and second multiple floating diffusion implant layers 209, 211 in order to produce reliable signals. Further, the entire photo-detection region can be used to collect incident modulated light and to generate charge carriers, thereby permitting use of such pixel devices in low-intensity incident light applications.

FIG. 2B depicts a schematic cross-sectional view and a potential distribution spanning a lateral dimension of the example pixel device depicted in FIG. 2A at a first instance in time. The potential distribution 220 spanning a lateral dimension 221 of the pixel device 200 (i.e., along the cross-sectional line 2B) is depicted in a schematic plot with the lateral dimension 221 on the x-axis and potential 222 on the y-axis. The voltage levels on the multiple first transfer gates 215 and the multiple second transfer gates 217 are operable to generate a potential distribution 220 with particular characteristics. For example, at a first instance in time the potential distribution 220 depicted in FIG. 2B can conduct charges generated within the photo-detection region 219 to the multiple first floating diffusion implant layers 209. At the same instance in time the voltage levels on the multiple first transfer gates 215 and multiple second transfer gates 217 are operable to generate a potential distribution 220 with particular characteristics as depicted in FIG. 2C and FIG. 2D.

Figures 2C, 2D:
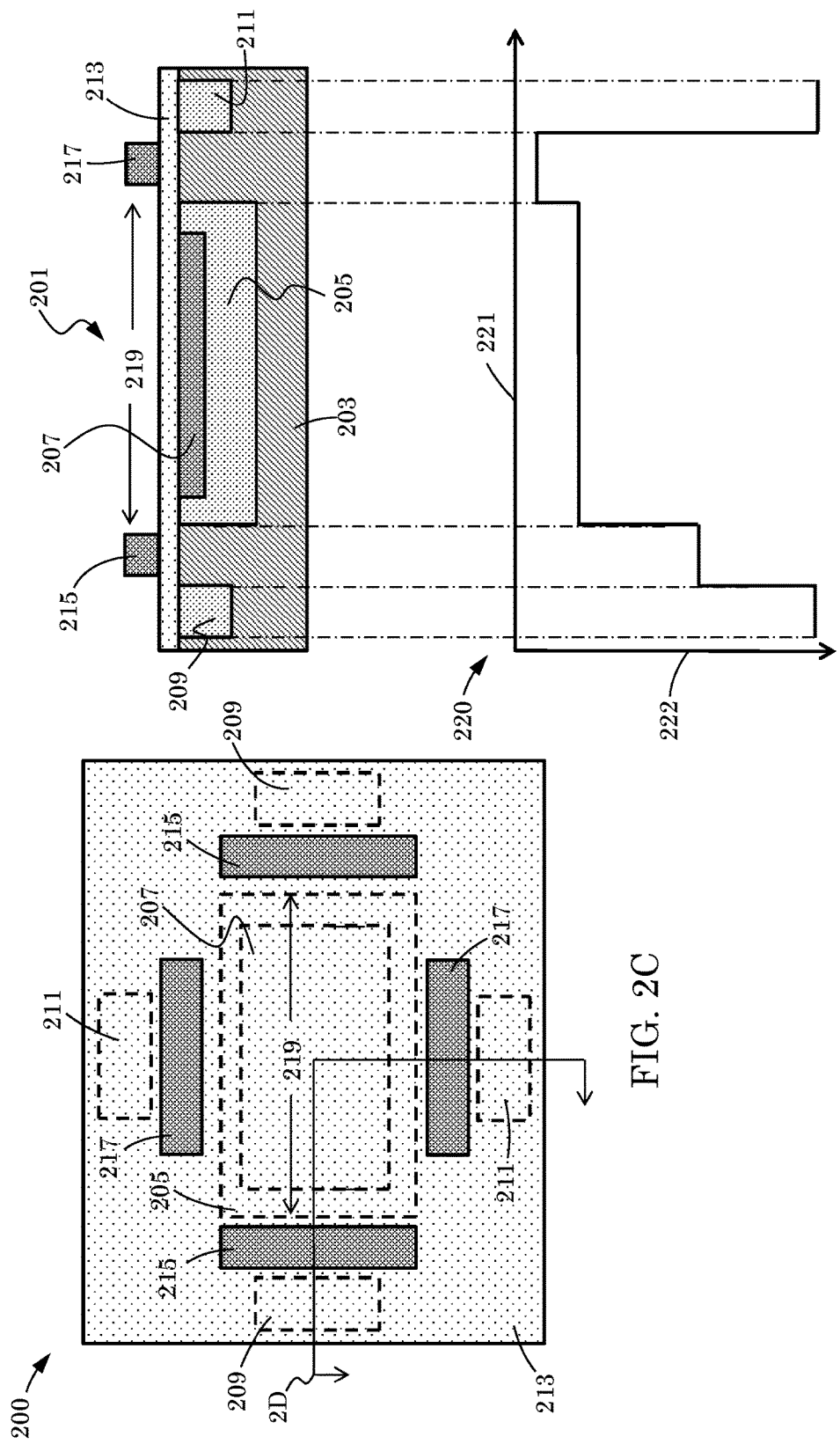
FIG. 2C depicts a schematic top view of an example pixel device.
FIG. 2D depicts another schematic cross-sectional view and another potential distribution spanning another lateral dimension of the example pixel device.

FIG. 2C depicts a schematic top view of the example pixel device and FIG. 2D depicts another schematic cross-sectional view of the potential distribution spanning another lateral dimension of the example pixel device (i.e., along the cross-sectional line 2D). The other potential distribution 220 depicted in FIG. 2D can conduct charge carriers generated within the photo-detection region 219 to the multiple first floating diffusion implant layers 209 and can inhibit charge carriers from being conducted into the multiple second floating diffusion implant layers 211. The voltage levels applied to the multiple first transfer gates 215 and multiple second transfer gates 217 can be modified at another instance in time such that the potential distribution 220 conducts charge carriers to the multiple second floating diffusion implant layers 211 and inhibits charge carrier conduction to the multiple first floating diffusion implant layers 209. The aforementioned can be repeated over multiple instances in time, such that sufficient charge carriers are alternately conducted to the multiple first and multiple second floating diffusion implant layers 209, 211 in order to produce reliable signals.

Figures 3A, 3B:
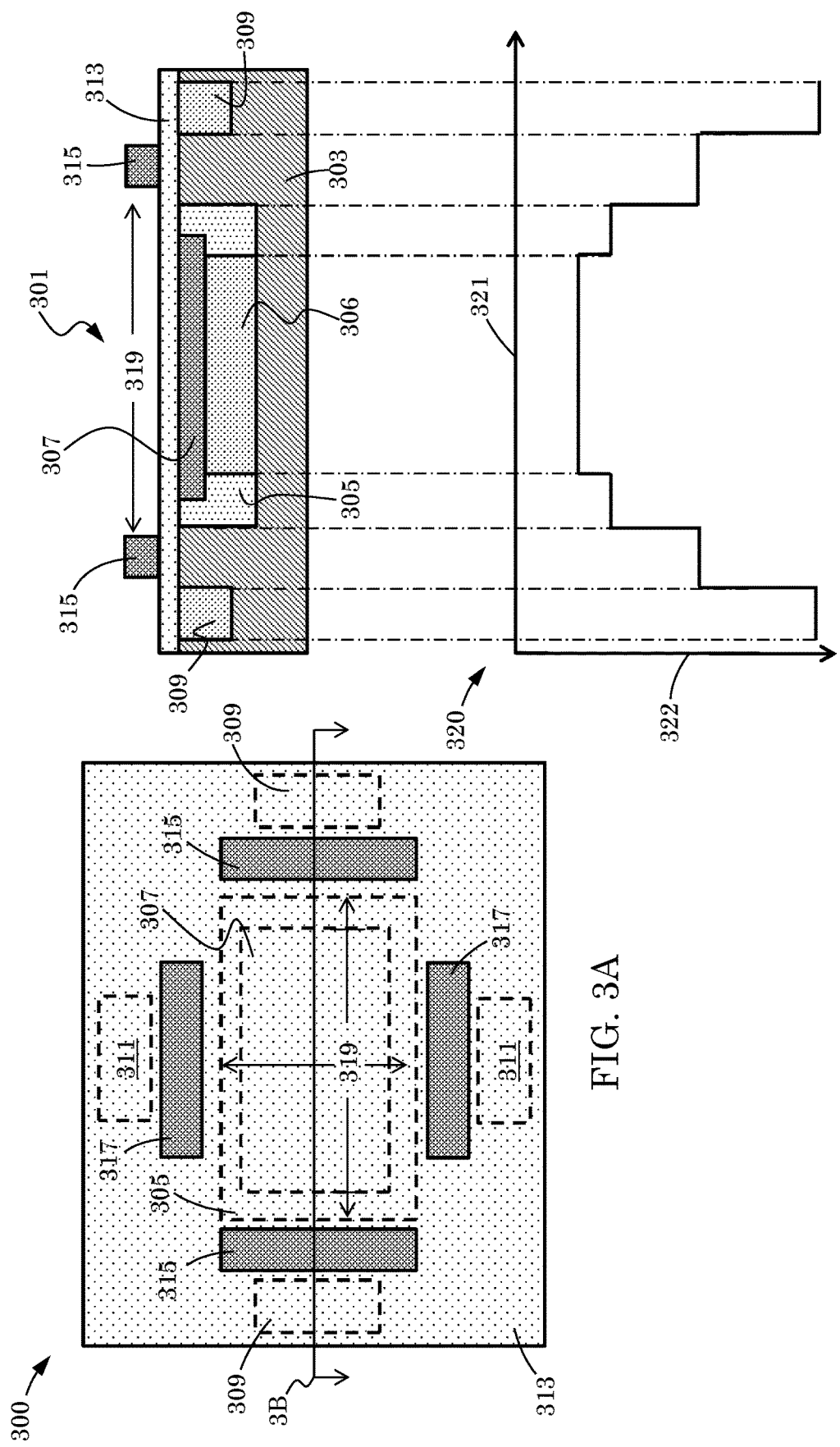
FIG. 3A depicts a schematic top view of still another example pixel device.
FIG. 3B depicts a schematic cross-sectional view and a potential distribution spanning a lateral dimension of the example pixel device.

FIG. 3A depicts a schematic top view of still another example pixel device 300. The pixel device 300 includes components as described above such as pinned photodiode structure 301, a p-type substrate 303, an n-type implant layer 305, a p-type implant layer 307, multiple first floating diffusion implant layers 309, multiple second floating diffusion implant layers 311, multiple first transfer gates 315, multiple second transfer gates 317, and a photo-detection region 319. However, the pixel device 300 also includes an auxiliary n-type implant layer 306. The auxiliary n-type implant layer 306 can be composed of a semiconductor material (e.g., crystalline silicon, polycrystalline silicon, germanium, indium gallium arsenide, lead sulphide, or indium phosphide) and can be the same material or can be contiguous with (e.g., epitaxially grown or deposited on) the p-type substrate 303. Further the majority of charge-carriers within the auxiliary n-type implant layer 306 can be electrons (e.g., occurring intrinsically or introduced via donor doping). In some implementations the intrinsic charge-carriers or doping concentration within the auxiliary n-type implant layer 306 can be different from the intrinsic charge-carriers or doping concentration within the n-type implant layer 305.

FIG. 3B depicts a schematic cross-sectional view and a potential distribution spanning a lateral dimension of the example pixel device depicted in FIG. 3A at a first instance in time. The potential distribution 320 spanning a lateral dimension 321 of the pixel device 300 (i.e., along the cross-sectional line 3B) is depicted in a schematic plot with the lateral dimension 321 on the x-axis and potential 322 on the y-axis. The voltage levels on the multiple first transfer gates 315 and the multiple second transfer gates 317 are operable to generate a potential distribution 320 with particular characteristics. For example, at a first instance in time the potential distribution 320 depicted in FIG. 3B can conduct charges generated within the photo-detection region 319 to the multiple first floating diffusion implant layers 309. The potential distribution 320 is influenced by the auxiliary n-type implant layer 306. Accordingly, in some instances conduction of charge-carriers through the p-type substrate 303 can be facilitated by the auxiliary n-type implant layer 306.

FIG. 4A depicts a schematic top view of yet another example pixel device 400. The pixel device 400 includes components as described above such as pinned photodiode structure 401, a p-type substrate 403, an n-type implant layer 405, a p-type implant layer 407, multiple first floating diffusion implant layers 409, multiple second floating diffusion implant layer 411, multiple first transfer gates 415, multiple second transfer gates 417, and a photo-detection region 419. The pixel device 400 also includes the multiple first transfer gates 415, multiple second transfer gates 417, multiple first floating diffusion implant layers 409, and multiple second floating diffusion implant layers 411 disposed in a hexagonal arrangement. The multiple transfer gates and floating diffusion implant layers permit charge carriers generated in the photo-detection region 419 to be conducted to multiple floating diffusion implant layers at any given instance in time as described above (e.g., as in the implementation depicted in FIG. 2A-2D). However, the hexagonal arrangement permits a substantial reduction in transport path over which the charge carriers.

FIG. 4B depicts a schematic cross-sectional view and a potential distribution spanning a lateral dimension of the example pixel device depicted in FIG. 4A at a first instance in time. The potential distribution 420 spanning a lateral dimension 421 of the pixel device 400 (i.e., along the cross-sectional line 4B) is depicted in a schematic plot with the lateral dimension 421 on the x-axis and potential 422 on the y-axis. The voltage levels on the multiple first transfer gates 415 and the multiple second transfer gates 417 are operable to generate a potential distribution 420 with particular characteristics. For example, at a first instance in time the potential distribution 420 depicted in FIG. 4B can conduct charges generated within the photo-detection region 419 to the multiple first floating diffusion implant layers 409. At the same instance in time the voltage levels on the multiple first transfer gates 415 and multiple second transfer gates 417 are operable to generate a potential distribution 420 with particular characteristics as depicted in FIG. 4C and FIG. 4D.

FIG. 4C depicts a schematic top view of the example pixel device and FIG. 4D depicts another schematic cross-sectional view of the potential distribution spanning another lateral dimension of the example pixel device (i.e., along the cross-sectional line 4D). The other potential distribution 420 depicted in FIG. 4D can conduct charge carriers generated within the photo-detection region 419 to the multiple first floating diffusion implant layers 409 and can inhibit charge carriers from being conducted into the multiple second floating diffusion implant layers 411. The voltage levels applied to the multiple first transfer gates 415 and multiple second transfer gates 417 can be modified at another instance in time such that the potential distribution 420 conducts charge carriers to the multiple second floating diffusion implant layers 411 and inhibits charge carrier conduction to the multiple first floating diffusion implant layers 409.

Figure 5B:
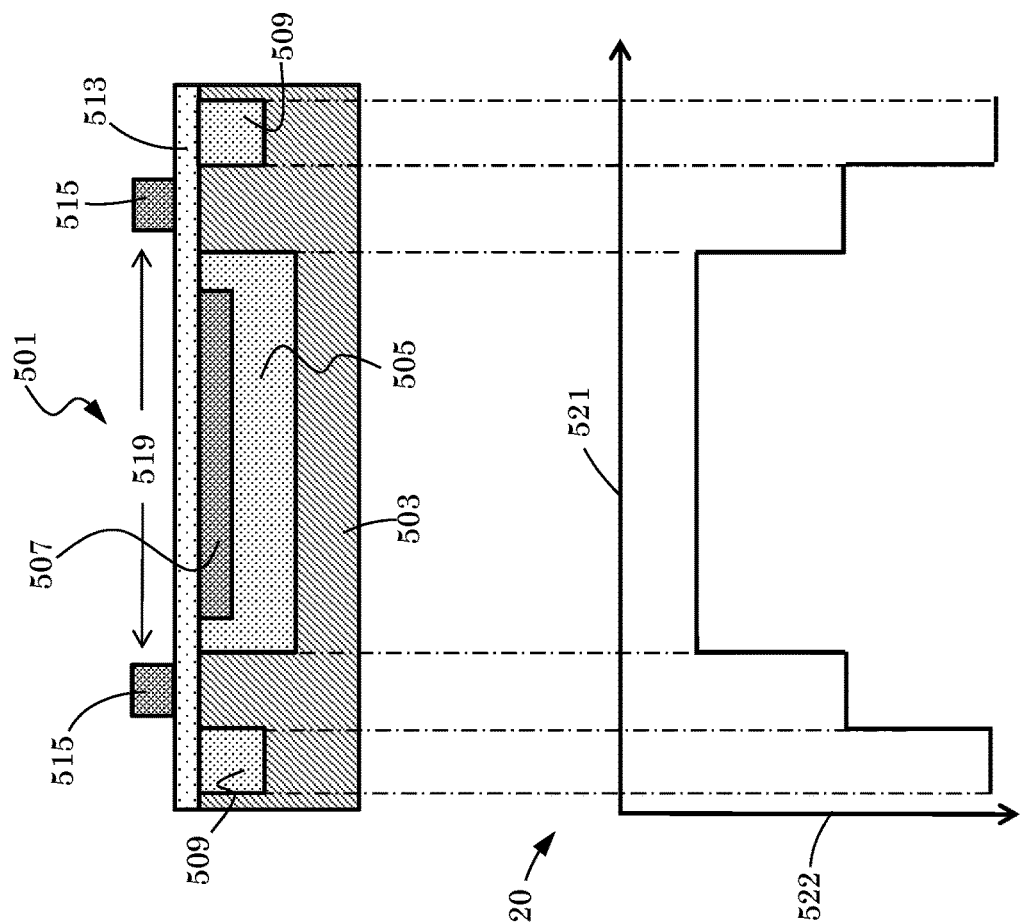
FIG. 5B depicts a schematic cross-sectional view and a potential distribution spanning a lateral dimension of the example pixel device.
Figure 5A:
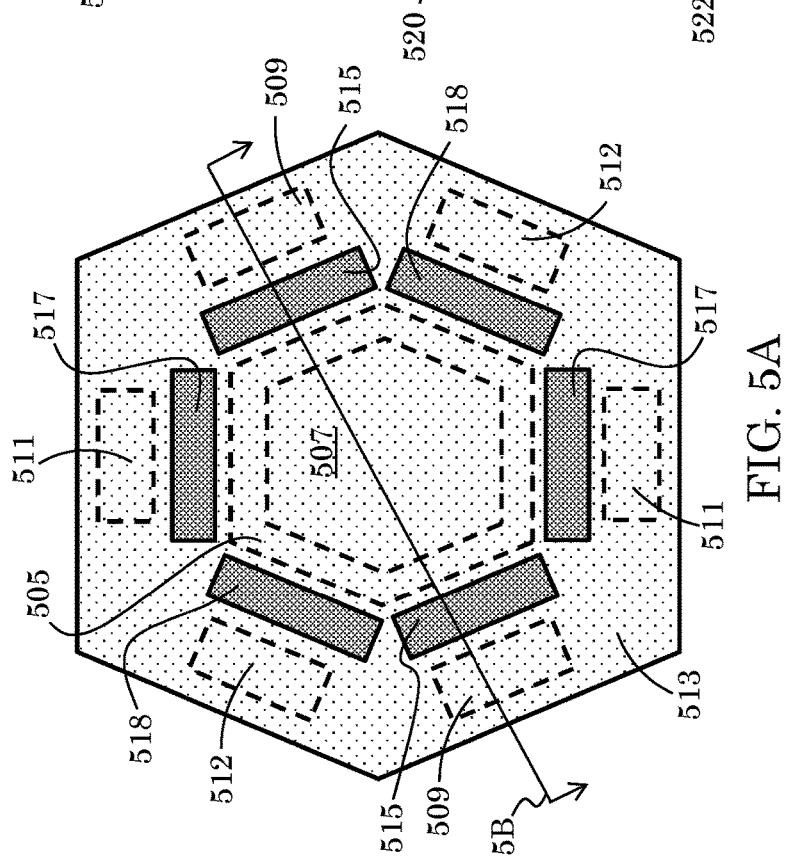
FIG. 5A depicts a schematic top view of still yet another example pixel device.

FIG. 5A depicts a schematic top view of still yet another example pixel device 500. The pixel device 500 includes components as described above such as pinned photodiode structure 501, a p-type substrate 503, an n-type implant layer 505, a p-type implant layer 507, multiple first floating diffusion implant layers 509, multiple second floating diffusion implant layer 511, multiple first transfer gates 515, multiple second transfer gates 517, and a photo-detection region 519. The pixel device 500 also includes auxiliary floating diffusion implant layers 512 (e.g., multiple auxiliary floating diffusion implant layers 512) and auxiliary transfer gate 518 (e.g., multiple auxiliary transfer gates 518). In the example implementation depicted in FIG. 5A, the multiple first transfer gates 515, multiple second transfer gates 517, multiple first floating diffusion implant layers 509, multiple second floating diffusion implant layers 511, multiple auxiliary floating diffusion implant layers 512, and multiple auxiliary transfer gates 518 are disposed in a hexagonal arrangement. The multiple transfer gates, floating diffusion layers, auxiliary floating diffusion layers, and auxiliary transfer gates permit charge carriers generated in the photo-detection region 519 to be conducted to multiple floating diffusion implant layers for any given instance in time as described above, for example, as in the implementation depicted in FIG. 2A-2D.

While the hexagonal arrangement permits a substantial reduction in transport path, as described in connection with the example implementation illustrated in FIG. 4A-4D, the auxiliary transfer gate or multiple auxiliary transfer gates, and/or the auxiliary floating diffusion implant layers or multiple auxiliary floating diffusion implant layers can permit the mitigation or elimination of common mode light (e.g., background light) and/or image ghosting. In some implementations the auxiliary components can drain away charge-carriers from the photo-detection region 519. For example, charge-carriers generated from common mode light can be conducted to the auxiliary floating diffusion implant layer and drained or dumped thereby preventing incursion of the common-mode charge carriers into any of the plurality of first or multiple second floating diffusion implant layers. Consequently, the photo-detection region 519 can be smaller than in other example implementations that do not employ an auxiliary floating diffusion implant layer (or multiple auxiliary floating layers) or an auxiliary transfer gate (or multiple auxiliary transfer gates) which can permit shorter transport paths, and in some instances can permit larger drift-fields within the p-type substrate 503, which in turn can permit larger drift velocities of the photo-generated charges. Further, the auxiliary transfer gate 518 or multiple auxiliary transfer gates 518, or auxiliary floating diffusion implant layer 512 or multiple auxiliary floating diffusion implant layers 512 can be operable to collect photo-generated charge carriers at a third instance in time.

FIG. 5B depicts a schematic cross-sectional view and a potential distribution spanning a lateral dimension of the example pixel device depicted in FIG. 5A at a first instance in time. The potential distribution 520 spanning a lateral dimension 521 of the pixel device 500 (i.e., along the cross-sectional line 5B) is depicted in a schematic plot with the lateral dimension 521 on the x-axis and potential 522 on the y-axis. The voltage levels on the multiple first transfer gates 515, the multiple second transfer gates 517, and the multiple auxiliary transfer gates 518 are operable to generate a potential distribution 520 with particular characteristics. For example, at a first instance in time the potential distribution 520 depicted in FIG. 5B can conduct charges generated within the photo-detection region 519 to the multiple first floating diffusion implant layers 509. At the same instance in time the voltage levels on the multiple first transfer gates 515, multiple second transfer gates 517, and the multiple auxiliary transfer gates 518 are operable to generate a potential distribution 520 with particular characteristics as depicted in FIG. 5C-5F.

FIG. 5C depicts a schematic top view of the example pixel device and FIG. 5D depicts another schematic cross-sectional view of the potential distribution spanning another lateral dimension of the example pixel device (i.e., along the cross-sectional line 5D). The potential distribution 520 depicted in FIG. 5D can conduct charge carriers generated within the photo-detection region 519 to the multiple first floating diffusion implant layers 509 and can inhibit charge carriers from being conducted into the multiple second floating diffusion implant layers 511 and the multiple auxiliary floating diffusion implant layers 512. The voltage levels applied to the multiple first transfer gates 515, multiple second transfer gates 517, and the multiple auxiliary transfer gates 518 can be modified at another instance in time such that the potential distribution 520 conducts charge carriers to the multiple second floating diffusion implant layers 511 and inhibits charge carrier conduction to the multiple first floating diffusion implant layers 509 and the multiple auxiliary floating diffusion implant layer 512. The aforementioned process can be repeated over multiple instances in time until sufficient charge-carriers are conducted to the multiple first floating diffusion implant layers 509 and multiple second floating diffusion implant layers 511 to produce a reliable signal.

FIG. 5E depicts a schematic top view of the example pixel device and FIG. 5F depicts another schematic cross-sectional view of the potential distribution spanning another lateral dimension of the example pixel device (i.e., along the cross-sectional line 5E). The potential distribution 520 depicted in FIG. 5F can occur at the first instance in time described above, wherein the potential distribution 520 depicted in FIG. 5E can conduct charge carriers generated within the photo-detection region 519 to the multiple first floating diffusion implant layers 509 and can inhibit charge carriers from being conducted into the multiple second floating diffusion implant layers 511 and the multiple auxiliary floating diffusion implant layers 512. The voltage levels applied to the multiple first transfer gates 515, multiple second transfer gates 517, and the multiple auxiliary transfer gates 518 can be modified at another instance in time such that the potential distribution 520 conducts charge carriers into the multiple auxiliary floating diffusion implant layers 512 in, for example, a charge-dump mode.

Figure 6A:
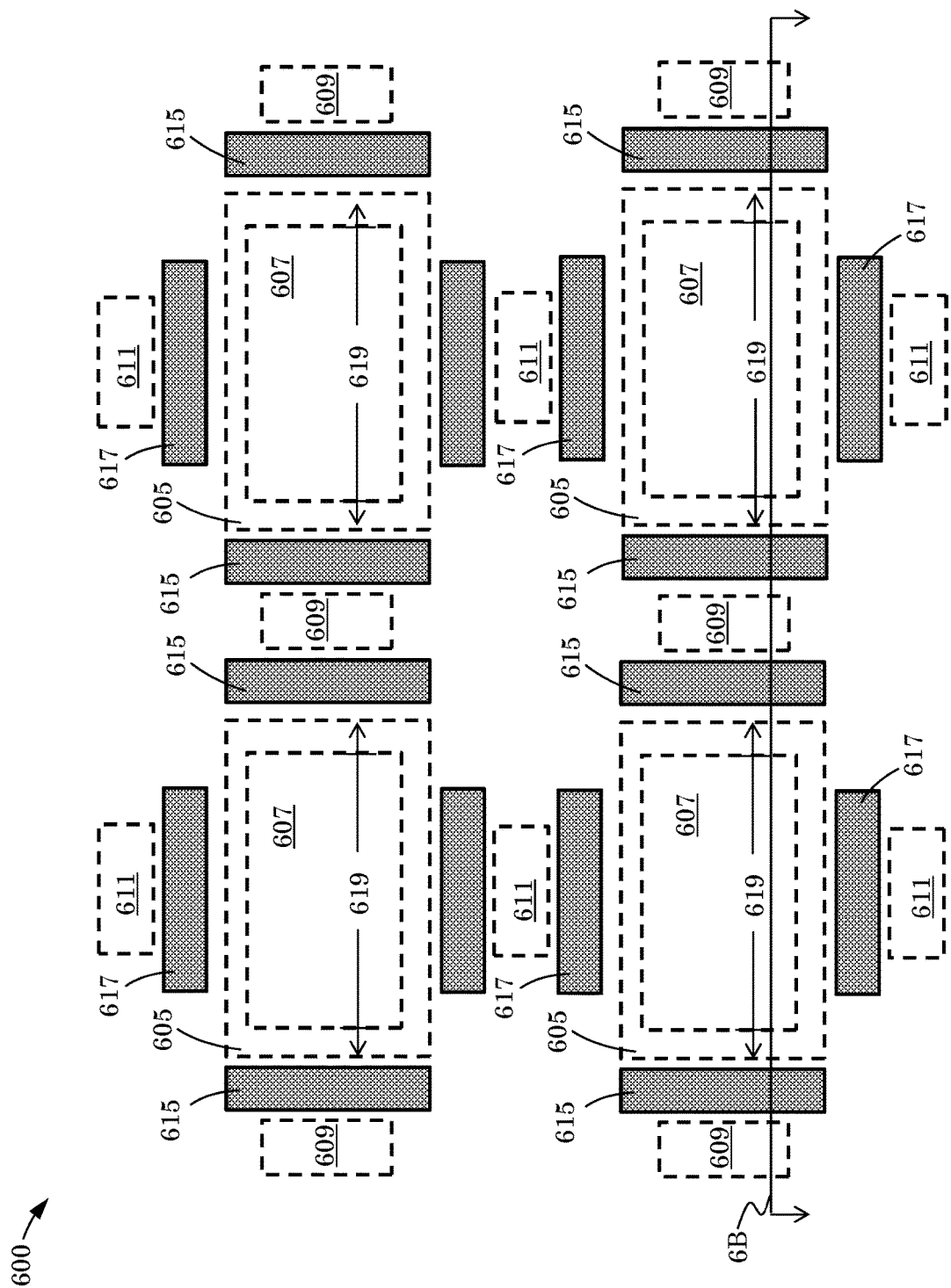
FIG. 6A depicts a schematic top view of an example pixel device array including shared floating diffusion implant layers.

FIG. 6A depicts a schematic top view of an example pixel device array including shared floating diffusion implant layers. The pixel device array 600 includes a plurality of pixel devices such as the pixel devices described above. Each pixel device within the pixel device array 600 can include a p-type substrate 603, a n-type implant layer 605, a p-type implant layer 607, an insulator layer 613, a first transfer gate 615, a second transfer gate 617, and a photo-detection region 619. Each pixel device can include at least one first floating diffusion implant layer 609 and at least one second floating diffusion implant layer 611 that is shared with an adjacent pixel device (additional first floating diffusion implant layer 609 and second floating diffusion implant layer 611 not shared with adjacent pixel devices are also within the scope of this disclosure). In some implementations, the shared first floating diffusion implant layer 609 and shared second floating diffusion implant layer 611 can provide advantages. For example, in some cases the shared components can facilitate pixel binning (e.g., wherein the sensitivity of the pixel devices are augmented by adjacent pixel devices having at least one mutually shared first floating diffusion implant layer 609 or at least one mutually shared second floating diffusion implant layer 611).

Figure 6B:
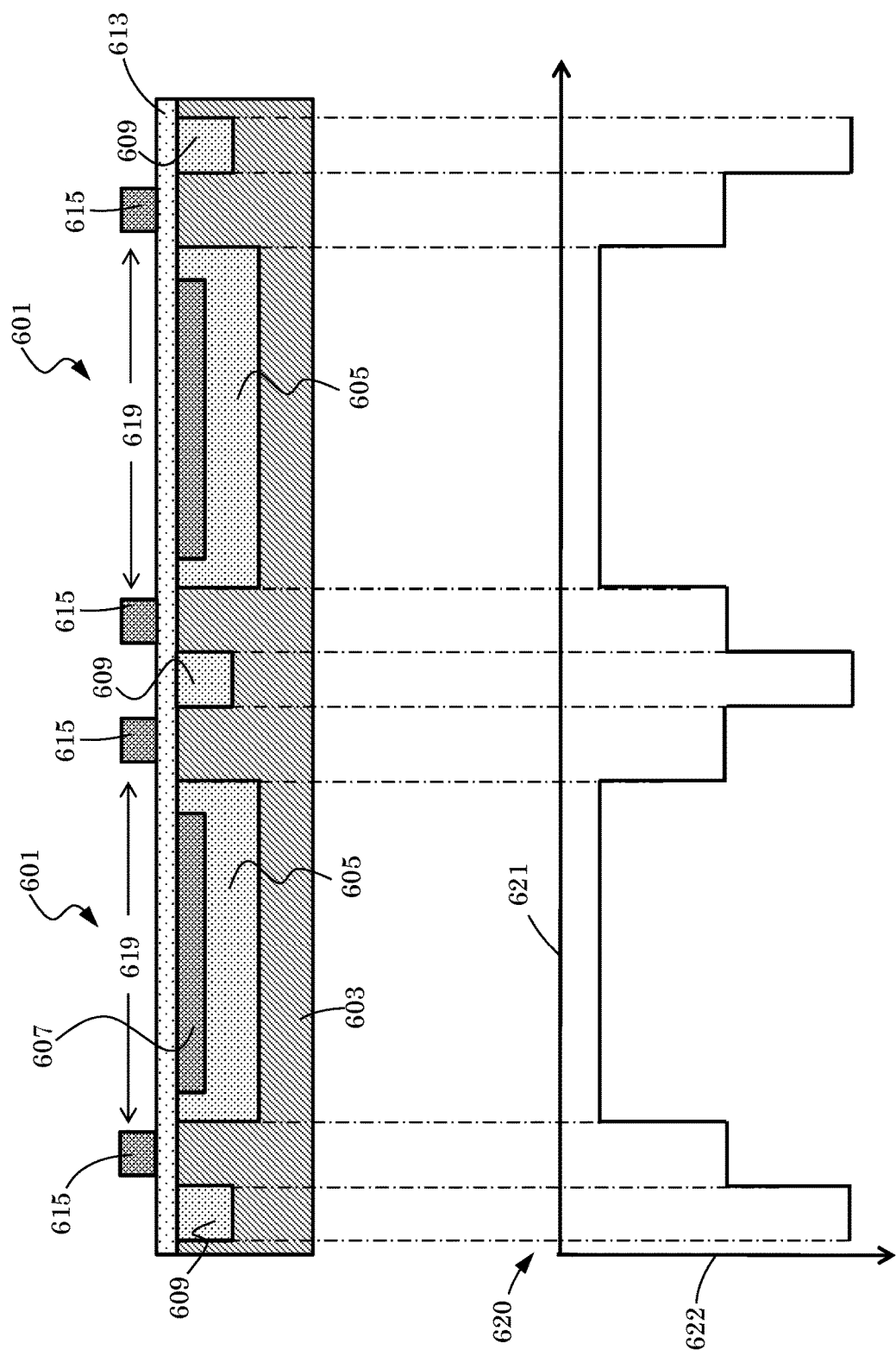
FIG. 6B depicts a schematic cross-sectional view of the example pixel device array and a potential distribution spanning a lateral dimension of the example pixel device array.

FIG. 6B depicts a schematic cross-sectional view of the example pixel device array and a potential distribution spanning a lateral dimension of the pixel device array depicted in FIG. 5A 6A at a first instance in time. The potential distribution 620 spanning a lateral dimension 621 of the pixel device array 600 (i.e., along the cross-sectional line 6B) is depicted in a schematic plot with the lateral dimension 621 on the x-axis and potential 622 on the y-axis. The voltage levels on the multiple first transfer gates 615, the multiple second transfer gates 617, and the multiple auxiliary transfer gates 618 are operable to generate a potential distribution 620 with particular characteristics. For example, at a first instance in time the potential distribution 620 depicted in FIG. 6B can conduct charges generated within the photo-detection region 619 to the multiple shared first floating diffusion implant layers 609. At the same instance in time the voltage levels on the multiple first transfer gates 615, and the multiple second transfer gates 617, are operable to inhibit charge transfer to the multiple shared second floating diffusion implant layers 611.

Figure 7:
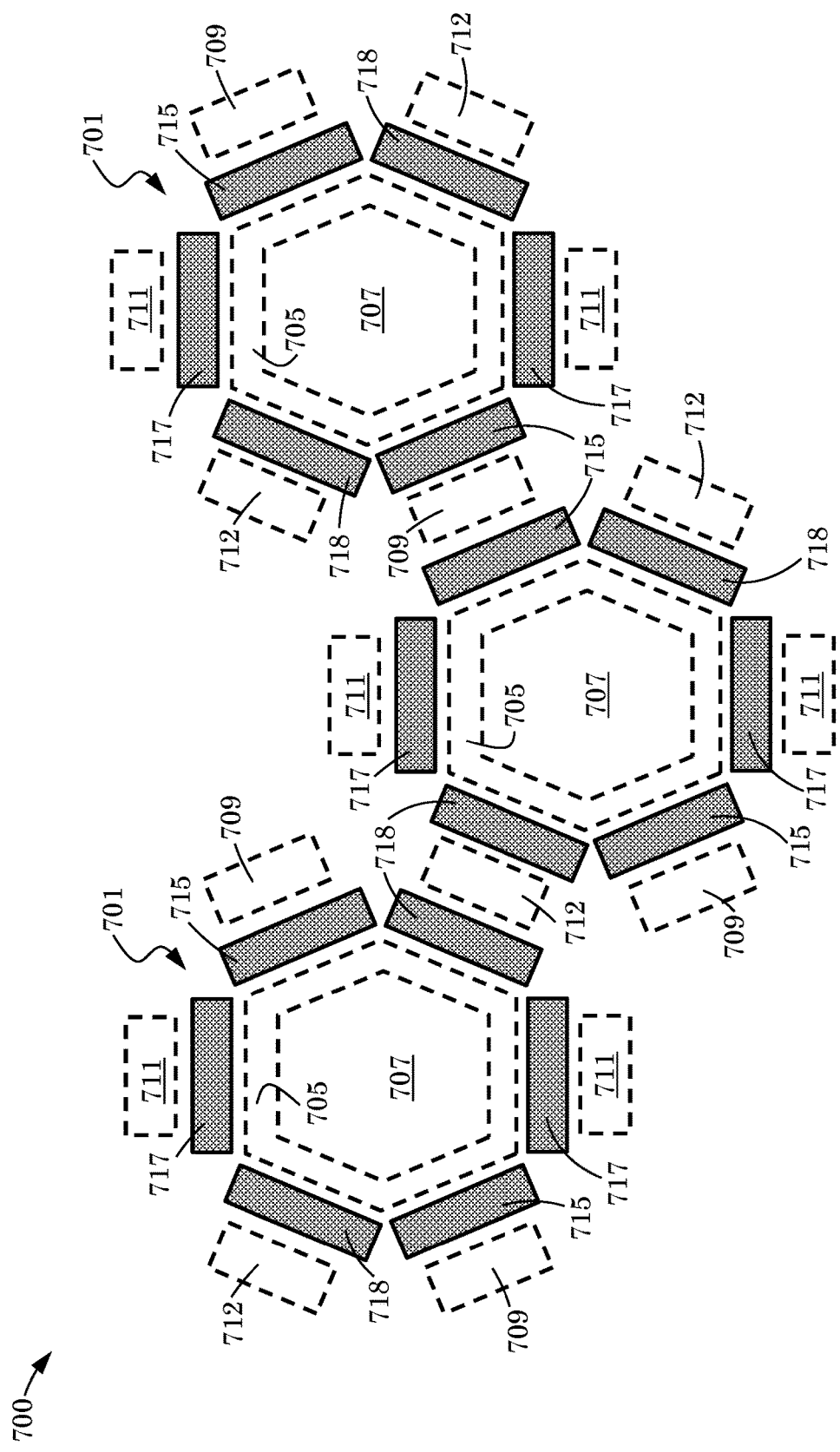
FIG. 7 depicts a schematic top view of another example pixel device array including shared floating diffusion implant layers.

FIG. 7 depicts a schematic top view of another example pixel device array including shared floating diffusion implant layers. The pixel device array 700 includes a plurality of pixel devices such as the pixel devices described above. Each pixel device within the pixel device array 700 can include a p-type substrate 703, an n-type implant layer 705, a p-type implant layer 707, an insulator layer 713, a first transfer gate 715, a second transfer gate 717, and a photo-detection region 719. Each pixel device can include at least one first floating diffusion implant layer 709 and at least one second floating diffusion implant layer 711 that are shared with an adjacent pixel device (additional first floating diffusion implant layer 709 and second floating diffusion implant layer 711 not shared with adjacent pixel devices are also within the scope of this disclosure). In some implementations, the shared first floating diffusion implant layer 709 and shared second floating diffusion implant layer 711 can provide advantages. For example, in some cases the shared components can facilitate pixel binning (e.g., wherein the sensitivity of the pixel devices are augmented by adjacent pixel devices having at least one mutually shared first floating diffusion implant layer 709 or at least one mutually shared second floating diffusion implant layer 711). In this example implementation the pixel devices are disposed hexagonally, wherein floating diffusion implant layers are shared by adjacent pixel devices. This implementation can have similar advantages as discussed above (e.g., as in the example implementations depicted in FIG. 4-6).

The various implementations described above are intended to be non-limiting. Consequently, combinations of the various features described above are within the scope of this disclosure. For example, various example implementations described above included pluralities of floating diffusion implant layers and transfer gates disposed hexagonally around a photo-detection area, however, other implementations can include pluralities of floating diffusion implant layers and transfer gates disposed circumferentially in any other way around a photo-detection area, octagonally for example. Still other arrangements that minimize the charge-carrier transport path from the photo-detection region to the floating diffusion implant layers are within the scope of the present disclosure. Further, various components have been described above as having a majority charge carrier concentration of either holes or electrons, p-type or n-type, respectively. In other implementations the majority charge carrier can be the opposite of what has been disclosed. For example, some implementations include a pinned photodiode structure having a p-type substrate, an n-type implant layer, and a p-type implant layer disposed on top of the n-type implant layer. Still other variations are within the scope of the present disclosure.

What is claimed is:

1. A pixel device operable to demodulate incident modulated light, the pixel device comprising:
   a pinned photodiode structure including a substrate of a first type, an implant layer of a second type, an implant layer of the first type disposed within the implant layer of the second type, an insulator disposed on a surface of the substrate, and a photo-detection region, operable such that modulated light and common mode light incident on the photo-detection region generate charge-carriers of the second type, the charge-carriers having modulation characteristics of the incident modulated light;
   a plurality of first transfer gates and a plurality of second transfer gates disposed on a surface of the insulator wherein the plurality of first transfer gates and the plurality of second transfer gates are operable to generate a field within the substrate of the first type; and
   a plurality of first floating diffusion implant layers of the second type and a plurality of second floating diffusion implant layers of the second type disposed within the substrate of the first type;
   wherein the plurality of first transfer gates and the plurality of second transfer gates are operable to conduct the charge-carriers to the plurality of first floating diffusion implant layers at a first instance in time, and the plurality of first transfer gates and the plurality of second transfer gates are operable to conduct the charge-carriers to the plurality of second floating diffusion implant layers at a second instance in time, and
   wherein the pixel device further comprises an auxiliary implant layer of the second type disposed within the implant layer of the second type.

2. The pixel device as in claim 1, further comprising at least one auxiliary transfer gate and at least one auxiliary floating diffusion implant layer of the second type.

3. The pixel device as in claim 2, wherein the first, second, and auxiliary transfer gates are operable to conduct charge-carriers generated by the common mode light to the auxiliary floating diffusion implant layer of the second type.

4. The pixel device according to claim 3, further comprising a plurality of auxiliary transfer gates and a plurality of auxiliary floating diffusion implant layers of the second type wherein the first transfer gates, second transfer gates, and the plurality of auxiliary transfer gates are operable to conduct charge-carriers generated by the common mode light to the plurality of auxiliary floating diffusion implant layers of the second type.

5. The pixel device of claim 4, wherein at least one of the plurality of first floating diffusion implant layers of the second type disposed within the substrate of the first type is shared with another pixel device,
   wherein at least one of the plurality of second floating diffusion implant layers of the second type disposed within the substrate of the first type is shared with another pixel device,
   optionally wherein the plurality of first transfer gates, the plurality of second transfer gates, the plurality of first floating diffusion implant layers, and the plurality of second floating diffusion implant layers are hexagonally disposed around the photo-detection region, and
   optionally wherein the plurality of first transfer gates, the plurality of second transfer gates, the plurality of first floating diffusion implant layers, and the plurality of second floating diffusion implant layers are octagonally disposed around the photo-detection region.

6. The pixel device as in claim 2, wherein the plurality of first transfer gates, the plurality of second transfer gates, and the at least one auxiliary transfer gate are operable to conduct the charge-carriers to the plurality of first floating diffusion implant layers, the plurality of second floating diffusion implant layers, or the at least one auxiliary floating diffusion implant layer at a third instance in time.

7. The pixel device as in claim 6, wherein the plurality of first transfer gates, the plurality of second transfer gates, and the at least one auxiliary transfer gate are operable to conduct the charge-carriers to the plurality of first floating diffusion implant layers, the plurality of second floating diffusion implant layers, or the at least one auxiliary floating diffusion implant layer at a fourth instance in time.

8. The pixel device as in claim 1, wherein the plurality of first transfer gates, the plurality of second transfer gates, the plurality of first floating diffusion implant layers, and the plurality of second floating diffusion implant layers are circumferentially disposed around the photo-detection region such that the charge-carrier transport paths to the floating diffusion implant layers are minimized.

9. The pixel device as in claim 8, wherein the plurality of first transfer gates, the plurality of second transfer gates, the plurality of first floating diffusion implant layers, and the plurality of second floating diffusion implant layers are hexagonally disposed around the photo-detection region.

10. The pixel device as in claim 8, wherein the plurality of first transfer gates, the plurality of second transfer gates, the plurality of first floating diffusion implant layers, and the plurality of second floating diffusion implant layers are octagonally disposed around the photo-detection region.

11. The pixel device as in claim 8, wherein each first transfer gate within the plurality of first transfer gates are disposed at opposing sides of the photo-detection region, and each second transfer gate within the plurality of second transfer gates are disposed at opposing sides of the photo-detection region.

12. The pixel device as claim 1, wherein the plurality of first transfer gates and the plurality of second transfer gates are operable to conduct the charge-carriers to the plurality of first floating diffusion implant layers or the plurality of second floating diffusion implant layers at a third instance in time.

13. The pixel device as claim 12, wherein the plurality of first transfer gates and the plurality of second transfer gates are operable to conduct the charge-carriers to the plurality of first floating diffusion implant layers or the plurality of second floating diffusion implant layers at a fourth instance in time.

14. The pixel device as in claim 1, wherein holes are the majority charge-carriers within components of the first type, and electrons are the majority charge-carriers within components of the second type.

15. The pixel device as in claim 1, wherein electrons are the majority charge-carriers within components of the first type, and holes are the majority charge-carriers within components of the second type.

16. A pixel device of claim 5, operable to demodulate incident modulated light, the pixel device comprising:
- a pinned photodiode structure including a substrate of a first type, an implant layer of a second type, an implant layer of the first type disposed within the implant layer of the second type, an insulator disposed on a surface of the substrate, and a photo-detection region, operable such that modulated light and common mode light incident on the photo-detection region generate charge-carriers of the second type, the charge-carriers having modulation characteristics of the incident modulated light;
- a plurality of first transfer gates and a plurality of second transfer gates disposed on a surface of the insulator, wherein the plurality of first transfer gates and the plurality of second transfer gates are operable to generate a field within the substrate of the first type; and
- a plurality of first floating diffusion implant layers of the second type and a plurality of second floating diffusion implant layers of the second type disposed within the substrate of the first type;
- wherein the plurality of first transfer gates and the plurality of second transfer gates are operable to conduct the charge-carriers to the plurality of first floating diffusion implant layers at a first instance in time, and the plurality of first transfer gates and the plurality of second transfer gates are operable to conduct the charge-carriers to the plurality of second floating diffusion implant layers at a second instance in time;
- wherein the plurality of first transfer gates, the plurality of second transfer gates, the plurality of first floating diffusion implant layers, and the plurality of second floating diffusion implant layers are circumferentially disposed around the photo-detection region such that the charge-carrier transport paths to the floating diffusion implant layers are minimized; and
- wherein at least one of the plurality of second floating diffusion implant layers of the second type disposed within the substrate of the first type is shared with another pixel device.

17. The pixel device of claim 16, wherein the plurality of first transfer gates, the plurality of second transfer gates, the plurality of first floating diffusion implant layers, and the plurality of second floating diffusion implant layers are octagonally disposed around the photo-detection region.

18. The pixel device of claim 16, wherein the plurality of first transfer gates, the plurality of second transfer gates, the plurality of first floating diffusion implant layers, and the plurality of second floating diffusion implant layers are hexagonally disposed around the photo-detection region.

19. A pixel device operable to demodulate incident modulated light, the pixel device comprising:
- a pinned photodiode structure including a substrate of a first type, an implant layer of a second type, an implant layer of the first type disposed within the implant layer of the second type, an insulator disposed on a surface of the substrate, and a photo-detection region, operable such that modulated light and common mode light incident on the photo-detection region generate charge-carriers of the second type, the charge-carriers having modulation characteristics of the incident modulated light;
- a plurality of first transfer gates and a plurality of second transfer gates disposed on a surface of the insulator, wherein the plurality of first transfer gates and the plurality of second transfer gates are operable to generate a field within the substrate of the first type; and
- a plurality of first floating diffusion implant layers of the second type and a plurality of second floating diffusion implant layers of the second type disposed within the substrate of the first type;
- wherein the plurality of first transfer gates and the plurality of second transfer gates are operable to conduct the charge-carriers to the plurality of first floating diffusion implant layers at a first instance in time, and the plurality of first transfer gates and the plurality of second transfer gates are operable to conduct the charge-carriers to the plurality of second floating diffusion implant layers at a second instance in time; and
- wherein the plurality of first transfer gates, the plurality of second transfer gates, the plurality of first floating diffusion implant layers, and the plurality of second floating diffusion implant layers are hexagonally disposed around the photo-detection region or octagonally disposed around the photo-detection region.

20. The pixel device of claim 19, wherein at least one of the plurality of second floating diffusion implant layers of the second type disposed within the substrate of the first type is shared with another pixel device.

* * * * *